United States Patent [19]

Shimizu

[11] Patent Number: 4,845,544
[45] Date of Patent: Jul. 4, 1989

[54] SEMICONDUCTOR INTEGRATED DEVICE HAVING A FIELD-EFFECT TRANSISTOR TYPE MEMORY CELL ARRAY AND PERIPHERAL CIRCUITRY STRUCTURE

[75] Inventor: Shinji Shimizu, Hoya, Japan

[73] Assignee: Hitachi, Ltd., Tokyo, Japan

[21] Appl. No.: 35,010

[22] Filed: Mar. 26, 1987

[30] Foreign Application Priority Data

Mar. 26, 1986 [JP] Japan .................................. 61-65695

[51] Int. Cl.⁴ ...................... H01L 29/78; H01L 29/54; H01L 23/48; H01L 27/10
[52] U.S. Cl. ........................................ 357/71; 357/41; 357/45; 357/23.6
[58] Field of Search ...................... 357/23.6, 71, 41, 45

[56] References Cited

U.S. PATENT DOCUMENTS

| | | | |
|---|---|---|---|
| 4,451,841 | 5/1984 | Hori et al. | 357/23.6 |
| 4,612,565 | 9/1986 | Shimizu et al. | 357/71 |
| 4,673,969 | 6/1987 | Ariizumi et al. | 357/41 |
| 4,695,864 | 9/1987 | Kawamoto | 357/23.6 |

OTHER PUBLICATIONS

*Nikkei Electronics*, 5/25/81, pp. 130–144, Japan.

*Primary Examiner*—Andrew J. James
*Assistant Examiner*—Jerome Jackson, Jr.
*Attorney, Agent, or Firm*—Antonelli, Terry & Wands

[57] ABSTRACT

A semiconductor integrated circuit device having first and second field-effect transistors, wherein the gate electrode of the first field-effect transistor is defined by a first-level conductor layer, while a wiring which is connected to the source or drain region of the first field-effect transistor is defined by a second-level conductor layer, and the gate electrode of the second field-effect transistor is defined by a combination of the first- and second-level conductor layers which are stacked one upon the other. Further, the respective gate electrodes of the first and second field-effect transistors are formed through respective gate insulator films which are formed on the principal surface of a semiconductor substrate in the same manufacturing step. By virtue of the above-described means, it is possible to reduce the area required for connection between the source or drain region of the first field-effect transistor and the wiring and to thereby increase the scale of integration of the device. In addition, it is possible to lower the resistance of the gate electrode of the second field-effect transistor and to thereby increase the operating speed of the device. Since the first and second field-effect transistors can be formed on a semiconductor substrate having no damage generated thereto, it is possible to increase the dielectric strength of the gate insulator film and to thereby improve the electrical reliability of the device.

20 Claims, 6 Drawing Sheets

SEMICONDUCTOR INTEGRATED DEVICE HAVING A FIELD-EFFECT TRANSISTOR TYPE MEMORY CELL ARRAY AND PERIPHERAL CIRCUITRY STRUCTURE

BACKGROUND OF THE INVENTION

The present invention relates to a semiconductor integrated circuit device and, more particularly, to a technique which may effectively be applied to a semiconductor integrated circuit device having field-effect transistors.

As semiconductor integrated circuit device having a storage function, a semiconductor integrated circuit device having a dynamic random-access memory (hereinafter abbreviated as a "DRAM") is known. Each of the memory cells in the DRAM is constituted by a series circuit consisting of a switching MISFET and a data storage capacitance element which are connected in series. The memory cells are respectively disposed at the intersections between word lines and data lines and are electrically connected to the corresponding word and data lines.

In one type of DRAM which adopts the folded bit line system, data lines are defined by a layer which extends above word lines. The word lines are defined by the same conductor layer as the gate electrodes of the switching MISFETs, for example, a polycrystalline silicon film. The data lines are formed from, for example, an aluminum film having an extremely small resistivity.

This type of DRAM however needs an unfavorably large area for connection between the memory cells (the source or drain regions of the switching MISFETs) and the data lines, and this disadvantageously prevents an increase in the scale of integration of the device. The area required for connection between the memory cells and the data lines mainly includes the area actually consumed for connection between these elements and the following various kinds of area: a margin of area needed to be left for mask alignment in the process for producing the memory cells and the data lines; an area needed to ensure the required dielectric strength of the region between the gate electrodes of the switching MISFETs and the data lines; and an area which is sufficiently large to prevent any damage to a field insulator film (isolation region) which defines the configuration of the switching MISFETs during formation of contact holes for connection between the memory cells and the data lines.

In view of the above-described circumstances, there has been devised a technique (self-aligned contact technique) with which data lines which are connected to the source or drain regions of MISFETs (memory cells) in a DRAM are self-aligned with respect to the gate electrodes of the MISFETs. This technique is described in the May 25, 1981, issue of "Nikkei Electronics", p. 132.

SUMMARY OF THE INVENTION

The present inventor made an exhaustive study for the purpose of developing a self-aligned contact technique which may effectively be employed to produce DRAMs. The following is a brief summary of a technique examined by the present inventor, resulting in the development in a new and useful technique and new and useful semiconductor integrated circuit devices.

Above the gate electrode of a MISFET, a first insulator film is formed so as to electrically isolate the gate electrode from a data line. Thereafter, a second insulator film (side wall) is formed at each side of the gate electrode, and a first contact hole is formed using this second insulator film in self-alignment with respect to the gate electrode. The second insulator film is formed by, for example, subjecting a silicon oxide film formed by CVD to an anisotropic etching such as reactive ion etching (RIE). Thereafter, a third insulator film (intermediate insulator film) is formed all over the surface so as to cover the first and second insulator films, and the third insulator film at the first contact hole is removed to form a second contact hole. The second contact hole is formed so as to have a larger opening dimension than that of the first contact hole in consideration of a margin of area needed to be left for mask alignment carried out in the manufacturing process with respect to the first contact hole. Then, a data line is formed that is electrically connected to the source or drain region of the MISFET through the second and first contact holes. This data line can be connected to the source or drain region in a self-alignment manner mainly through the first contact hole.

In other words, this technique eliminates the need to leave a margin of area for mask alignment in the process for producing a DRAM and therefore enables a reduction in the area required for connection between memory cells and data lines, thereby allowing an increase in the scale of integration of the device.

The present inventor made study to increase the operating speed of the above-described DRAM and has found that the following problems are experienced in designing the DRAM so as to operate at higher speed.

The gate electrode of a switching MISFET of each memory cell and the gate electrode of a MISFET which constitutes a peripheral circuit are also used as wirings for connection between word lines and between semiconductor elements. For this reason, it is necessary to use a material having a relatively small resistivity for producing each gate electrode. At the present time, it is advantageous to employ as such material a composite film (polycide film) formed from a polycrystalline silicon film and a refractory metal silicide film provided thereon.

In the case where each of the above-described gate electrodes is formed from a polycide film, it is critical to decide in which step among those in the process for producing the DRAM the polycide film should be formed. It is undesirable to form two layers of polycide film because such a structure would increase the number of steps required to produce the DRAM and lead to instability in the production. Further, since the multilayer wiring structure of the DRAM involves a considerably steep step configuration, it is undesirable to form, particularly, two layers of polycide film having a relatively large film thickness. Accordingly, the gate electrode of a MISFET constituting a peripheral circuit is selected to be formed in the same manufacturing step as that for the gate electrode (word line) of a switching MISFET or a data line.

When the gate electrode of a MISFET constituting a peripheral circuit is formed in the same manufacturing step as that for word lines, the following problems arise. When a second contact hole is formed by etching the above-described third insulator film (intermediate insulator film), the first insulator film on the gate electrode is over-etched. Therefore, the first insulator film must have a relatively large film thickness. As the thickness of the first insulator film increases, the contact hole which connects together the gate electrode of the MISFET constituting a peripheral circuit and wiring (for example, aluminum wiring) which is defined by a layer above said gate electrode becomes deeper. Accordingly, it becomes difficult to form the contact hole, and the coverage of the wiring at the stepped portion of the contact hole lowers giving rise to problems such as disconnection of the wiring, resulting, disadvantageously, in lowering in the electrical reliability.

When the gate electrode of a MISFET constituting a peripheral circuit is formed in the same manufacturing step as that for data lines, the following problems arise. When a first contact hole is formed in a memory cell forming region by self-alignment using the above-described second insulator film, there is damage to the principal surface of the semiconductor substrate in a region for forming the MISFET constituting a peripheral circuit. This damage is caused due to the fact that the principal surface of the semiconductor substrate (the surface of silicon) is hit with etching means used in anisotropic etching for forming the second insulator film. The gate insulator film of the MISFET constituting a peripheral circuit is formed on the damaged principal surface of the semiconductor substrate after the step of forming the gate insulator film of the switching MISFET of a memory cell. The damaged principal surface of the semiconductor substrate deteriorates the quality of the gate insulator film, thus causing various problems such as lowering in the dielectric strength of the gate insulator film and deterioration with time of the threshold voltage. Accordingly, the electrical reliability of the MISFET constituting a peripheral circuit is lowered, disadvantageously.

It is an object of the present invention to provide a technique which enables an increase in the scale of integration and also an increase in the operating speed of a semiconductor integrated circuit device having field-effect transistors.

It is another object of the present invention to provide a technique which enables an improvement in the electrical reliability of the device, in addition to the above-described advantages.

The above and other objects and novel features of the present invention will become clear from the following description taken in conjunction with the accompanying drawings.

A represented one of the novel techniques disclosed in this application will briefly be described below.

In a semiconductor integrated circuit device having first and second field-effect transistors, the gate electrode of the first field-effect transistor is defined by a first-level conductor layer, while a wiring which is connected to the source or drain region of the first field-effect transistor is defined by a second-level conductor layer, and the gate electrode of the second field-effect transistor is defined by a combination of the first- and second-level conductor layers which are stacked one upon the other.

Further, the respective gate electrodes of the first and second field-effect transistors are formed through respective gate insulator films which are formed on the principal surface of a semiconductor substrate in the same manufacturing step.

By virtue of the above-described means, it is possible to reduce the area required for connection between the source or drain region of the first field-effect transistor and the wiring and to thereby increase the scale of integration of the device. In addition, it is possible to lower the resistance of the gate electrode of the second field-effect transistor and to thereby increase the operating speed of the device.

Since the first and second field-effect transistors can be formed on a semiconductor substrate having no damage generated thereto, it is possible to increase the dielectric strength of the gate insulator film and to thereby improve the electrical reliability of the device.

DESCRIPTION OF THE PREFERRED EMBODIMENTS

The arrangement of the present invention will be described hereinunder in detail by way of one embodiment in which the present invention is applied to a DRAM adopting the folded bit line system.

It should be noted that, throughout the drawings, the members or portions having the same functions are denoted by the same reference numerals and repetitive description thereof is omitted.

Figure 1:
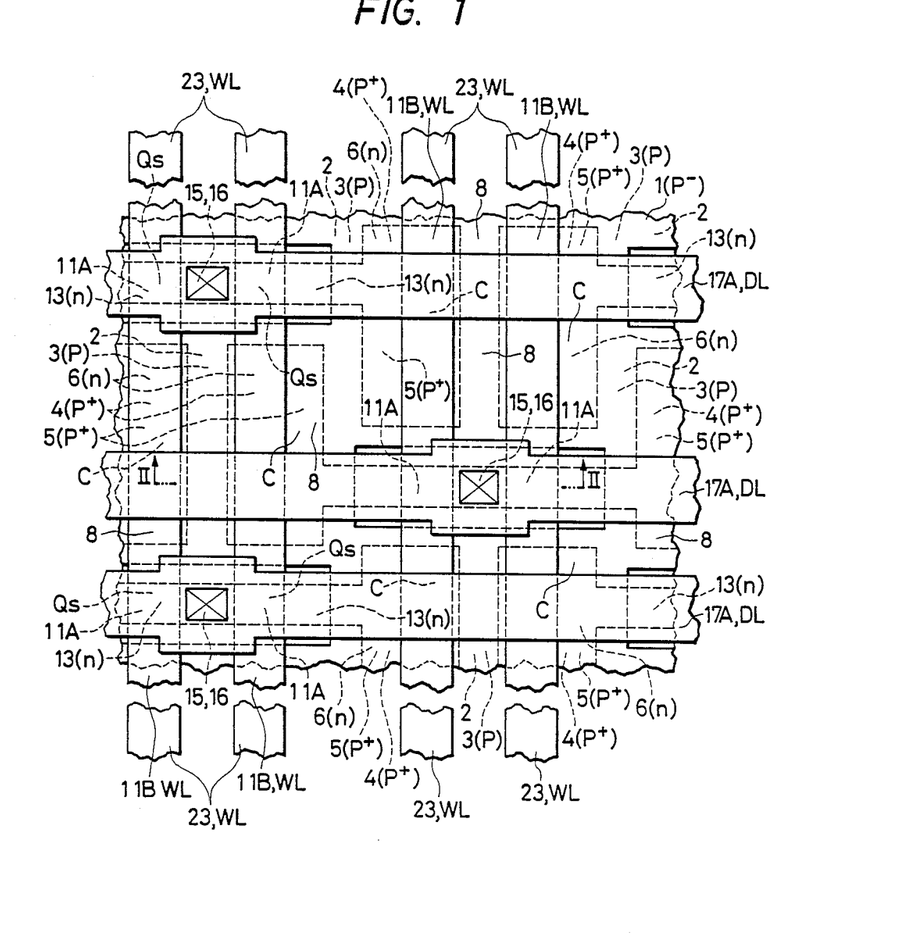
FIG. 1 is a fragmentary plan view of a memory cell array of a DRAM according to one embodiment of the present invention.
Figure 2:
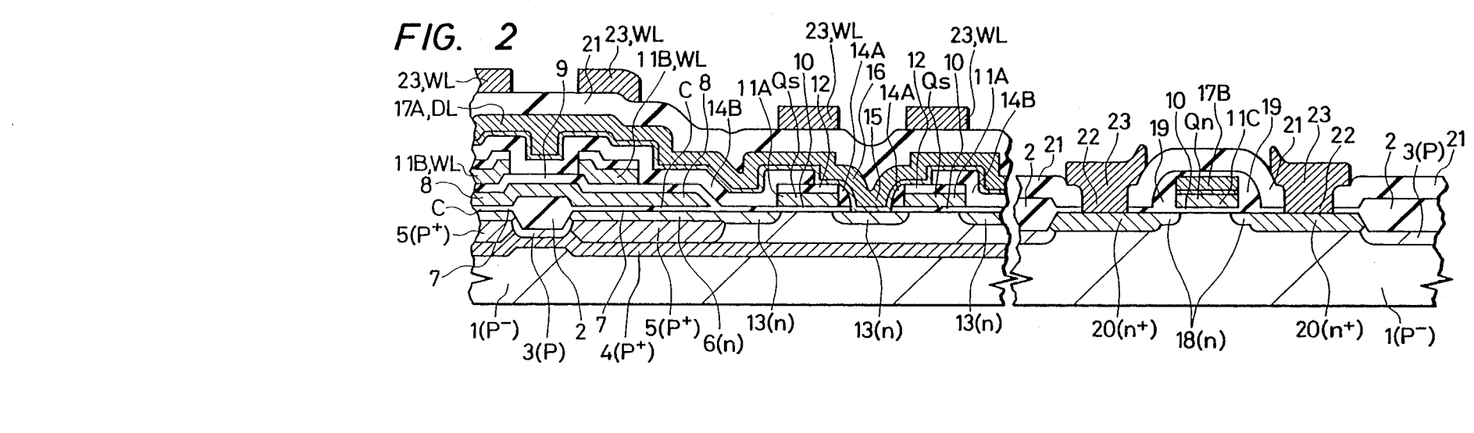
FIG. 2 is a fragmentary sectional view showing a portion of the arrangement of FIG. 1 taken along the line II—II and also a MISFET constituting a peripheral circuit.

A memory cell array of a DRAM according to one embodiment of the present invention is shown in FIG. 1 (a fragmentary plan view), and the cross-section of the memory cell array taken along the line II—II of FIG. 1 and the cross-section of a MISFET constituting a peripheral circuit are shown in FIG. 2 on the left- and right-hand sides, respectively, as viewed in the figure. FIG. 1 illustrates no insulator films other than a field insulator film in order to facilitate understanding of the arrangement of this embodiment.

In FIGS. 1 and 2, the reference numeral 1 denotes a p$^-$-type semiconductor substrate (or a well region) made from single crystal silicon. The semiconductor substrate 1 is provided with an n$^-$-type well region for constituting a p-channel MISFET of complementary MISFETs (CMOS's) although it is not illustrated.

A field insulator film 2 and a p-type channel stopper region 3 are provided on the principal surface of the semiconductor substrate 1 at the area between regions for forming semiconductor elements such as MISFETs. The field insulator film 2 and the channel stopper region 3 are arranged so as to electrically isolate the semiconductor elements from each other.

Each of the memory cells of the DRAM is constituted by a series circuit which consists of a switching MISFET Qs and a data storage capacitance element C which are formed on the principal surface of the semiconductor substrate 1 in a region surrounded by the field insulator film 2.

The data storage capacitance element C is composed of an MIS capacitance element consisting of an n-type semiconductor region 6, a dielectric film 7 and a plate electrode 8 and a pn junction capacitance element consisting of the semiconductor region 6 and a p+-type semiconductor region 5.

The n-type semiconductor region 6 is provided in the principal surface portion of the semiconductor substrate 1 within a region surrounded by the field insulator film 2 except for a portion thereof which is connected to the MISFET Qs. The semiconductor region 6 defines one of the electrodes of the data storage capacitance element C and is arranged such that a potential which defines data "0" or "1" is transmitted thereto from a data line (described later) through the MISFET Qs. The potential defining data "0" (or "1") is, for example, a power supply voltage (the operating voltage of 5 volts of the circuit) Vcc. The potential defining data "1" (or "0") is, for example, a reference voltage of (the ground voltage 0 volts of the circuit) Vss.

The dielectric film 7 is provided over the principal surface of the semiconductor region 6.

The plate electrode 8 is provided above the semiconductor region 6 with the dielectric film 7 interposed therebetween, the plate electrode 8 being formed integral with the plate electrode 8 of another data storage capacitance element C which is adjacent to the capacitance element C concerned. The plate electrode 8 defines the other electrode of the data storage capacitance element C and is supplied with a fixed potential for defining data "0" or "1". This fixed potential is set so as to be an intermediate voltage ($\neq 2.5$ volts) $\frac{1}{2}$ Vcc between the power supply voltage Vcc and the reference voltage Vss. An insulator film 9 is provided on the plate electrode 8 in such a manner as to cover the latter. The insulator film 9 is arranged so as to electrically isolate the plate electrode 8 from a word line (described later).

The p+-type semiconductor region 5 is provided in the principal surface portion of the semiconductor substrate 1 which is underneath and in contact with the semiconductor region 6. The semiconductor region 5 mainly defines the other electrode of the data storage capacitance element C, thus constituting a data storage capacitance element C having a structure designed to increase the amount of electric charges stored to constitute data.

The MISFET Qs consists of the semiconductor substrate 1, a gate insulator film 10, a gate electrode 11A and a pair of n-type semiconductor regions 13.

The gate insulator film 10 is provided on the principal surface of the semiconductor substrate 1 in a region which is surrounded by the field insulator film 2 except for portions thereof which are respectively connected to the data storage capacitance element C and to another memory cell. The field insulator film 2 is provided so as to define the gate width (channel width) of the MISFET Qs.

The gate electrode 11A is provided on the principal surface of the semiconductor substrate 1 through the gate insulator film 10. The gate electrode 11A is formed from, for example, a polycrystalline silicon film having an impurity implanted therein to lower the resistance thereof. The gate electrode 11A may also be formed from a single layer of refractory metal (Mo, Ti, Ta or W) film or refractory metal silicide ($MoSi_2$, $TiSi_2$, $TaSi_2$ or $WSi_2$) film or from a composite film consisting of a polycrystalline silicon film and such a refractory metal or refractory metal silicide film stacked thereon.

The gate electrodes 11A respectively constituting MISFETs Qs of memory cells which are adjacent to each other in the row direction are electrically connected together by a word line (WL) 11B which is formed integral therewith from the same conductor layer.

An insulator film 12 is provided on the gate electrode 11A and the word line (WL) 11B so as to electrically isolate them from a data line (described later). The insulator film 12 is adapted to be used as an etching stopper when a contact hole for electrical connection between one of the semiconductor regions 13 of the MISFET Qs and the corresponding data line is formed.

The n-type semiconductor regions 13 are provided in the principal surface portion of the semiconductor substrate 1 at both sides, respectively, of the gate electrode 11A, each of the regions 13 defining a source or drain region of the MISFET Qs. One of the semiconductor regions 13 is electrically connected to the data line. The other semiconductor region 13 is electrically connected to the semiconductor region 6, thus providing electrical connection between the MISFET Qs and the data storage capacitance element C. The first semiconductor region 13 is formed integral with the first semiconductor region 13 constituting the MISFET Qs of another memory cell which is adjacent to the memory cell concerned in the column direction.

The memory cell and another memory cell which is adjacent thereto in the column direction in which the data line extends are surrounded at their peripheries by the field insulator film 2 and thereby defined so that they have symmetrical configurations with respect to the connection with the data line. A plurality of pairs of memory cells which are arranged in symmetry with respect to each other are disposed in the column direction, and a plurality of such memory cells are disposed in such a manner as to be a half pitch offset from each other in the row direction in which the word lines 11B extend, thus constituting a memory cell array.

As shown in FIG. 2, a p+-type semiconductor region 4 is provided in the principal surface portion of the semiconductor substrate 1 below the MISFET Qs and the data storage capacitance element C of the memory cell. The semiconductor region 4 is provided in a relatively deep portion so that its highest impurity concentration portion is not in contact with the semiconductor regions 13 used as the source and drain regions, respectively, of the MISFET Qs. More specifically, the semiconductor region 4 is arranged in such a manner that the parasitic pn junction capacitance added to the semiconductor regions 13 will not be increased and the dielectric strength of the pn junction with the semiconductor regions 13 will not be deteriorated. The semiconductor region 4 is arranged so as to mainly prevent minority carriers (electrons) generated in a portion of the semiconductor substrate 1 which is deeper than it from entering the memory cell, particularly the data carrier storage portion thereof. In other words, the semiconductor region 4 defines a potential barrier against minority carriers.

One of the semiconductor regions 13 of the MISFET Qs of the memory cell which are thus arranged is electrically connected to a data line (DL) 17A through contact holes 15 and 16.

The contact hole 15 is defined by being surrounded with the field insulator films 2 and insulator films (side walls) 14A each provided at one side of each gate electrode 11A at which each electrode is connected to the data line 17A, the insulator film 14A being self-aligned with respect to the gate electrode 11A. The contact hole 15 is substantially self-aligned with respect to the field insulator film 2 also. The opening area of the contact hole 15 is substantially defined by the distance between the gate electrodes 11A, the distance between the field insulator films 2 in the gate width direction and the thickness of each insulator film 14A (the thickness thereof measured from the side surface of the gate electrode 11A). The required dielectric strength of the area between each gate electrode 11a and the data line 17A is ensured by means of the insulator film 12 provided on the upper side of the gate electrode 11A and the insulator film 14A on the side portion thereof. In other words, the contact hole 15 can be formed without the need for any margin of area for mask alignment carried out in the manufacturing process.

The contact hole 15 thus formed enables the required dielectric strength of the area between the gate electrode 11A and the data line 17A to be effectively ensured, and the formation of the contact hole 15 involves no fear of the field insulator film 2 being damaged. Since the contact hole 15 having the above-described arrangement allows a decrease in the area which is left for mask alignment carried out in the manufacturing process, it is possible to reduce the area required for the connection between one of the semiconductor regions 13 of the MISFET Qs of the memory cell and the data line 17A. In other words, it is possible to reduce the area occupied by each memory cell and to thereby increase the integration density of the DRAM.

The contact hole 16 is formed by removing the insulator film 14 at the contact hole 15, the film 14 covering the other side portion of the gate electrode 11A of the MISFET Qs of each memory cell, the other semiconductor region 13, the data storage capacitance element C, etc. Although the contact hole 16 is not self-aligned with respect to the gate electrode 11A or the like, since the contact hole 15 is formed by self-alignment, the portion for connection between the semiconductor region 13 and the data line 17A is substantially self-aligned with respect to the gate electrode 11A or the like. The insulator film 14A which defines the contact hole 15 is defined by the same insulator layer as that for the insulator film 14B for forming the contact hole 16.

The data line (DL) 17A is provided on the insulator film 14B so as to extend in the column direction. The data line 17A is formed from a single layer of a refractory metal film or a refractory metal silicide film which has a smaller resistivity than a polycrystalline silicon film, or a composite film consisting of a polycrystalline silicon film and a refractory metal or refractory metal silicide film stacked thereon. In other words, the data line 17A is formed by CVD, sputtering or other similar means.

Since the data line 17A is formed from a conductor layer which has a relatively small resistivity and which is formed by CVD, sputtering or the like that provides excellent coverage, it is possible to prevent disconnection of the data line 17A at stepped portions, for example, a step which is defined by the contact holes 15 and 16, and this enables an improvement in the electrical reliability. Accordingly, the gate electrode 11A, the word line 11B and the data line 17A can be formed from polycide films, respectively.

A word line (WL) 23 is provided above the data line (DL) 17A with an insulator film 21 interposed therebetween, the word line (WL) 23 extending in the same direction as that of the word line 11B. The word line 23 is electrically connected to the word line 11B through contact holes respectively formed in the insulator films 21 and 14B although these contact holes are not illustrated. The word line 23 is formed from a conductor layer having a smaller resistivity than that of the word line 11B, for example, an aluminum film or an aluminum film containing a predetermined additive (Si or Cu). In other words, the word line 23 is arranged so as to decrease the substantial resistivity of the word line 11B and thereby increase the signal transmission speed.

An n-channel MISFET Qn which constitutes a peripheral circuit, for example, a decoder circuit or a sense amplifier circuit, is provided on the principal surface of the semiconductor substrate in a region which is surrounded by the field insulator film 2. More specifically, the MISFET Qn consists of the semiconductor substrate 1, a gate insulator film 10, a gate electrode composed of conductor layers 11C and 17B, a pair of n-type semiconductor regions 18 and a pair of n+-type semiconductor regions 20.

The gate insulator film 10 is provided on the principal surface of the semiconductor region 1 in a region which is surrounded by the field insulator film 2, the gate insulator film 10 being defined by the same insulator layer as that for the gate insulator film 10 of the above-described MISFET Qs.

The gate electrode is formed by stacking the conductor layer 11C which is defined by the same conductor layer as that for the gate electrode 11A and the word line 11B and the conductor layer 17B which is defined by the same conductor layer as that for the data line 17A.

The peripheral circuit is provided with a wiring for electrical connection between semiconductor elements which has the same structure as that of the gate electrode of the MISFET Qn although the wiring is not illustrated.

Thus, the gate electrode of the MISFET constituting a peripheral circuit or the wiring having the same structure as that of this gate electrode is constituted by the conductor layers 11C and 17B which are stacked one upon the other, whereby the cross-sectional area of the gate electrode or the wiring is increased and the resistance thereof can be lowered, so that it is possible to increase the signal transmission speed.

The n+-type semiconductor regions 20 are provided in the principal surface portion of the semiconductor substrate 1 at both side portions of the gate electrode of the MISFET Qn and are used as the source and drain regions, respectively. The semiconductor regions 20 are formed mainly using, as an impurity implantation mask, insulator films (side walls) 19 provided at both sides, respectively, of the gate electrode by self-alignment and the field insulator film 2.

The n-type semiconductor regions 18 are provided in the principal surface portion of the semiconductor substrate 1 between the channel forming region (the semiconductor substrate 1) and the semiconductor regions 20 used as the source and drain regions, respectively. The semiconductor regions 18 constitute a MISFET Qn having the LDD (Lightly Doped Drain) structure and are arranged to mainly lower the field strength in the vicinity of the drain region.

The semiconductor regions 20 of the MISFET Qn which are thus arranged are electrically connected to wirings 23 through contact holes 22, respectively, which are provided in the insulator film 21. The wirings 23 are formed from the same conductor layer as that for the word lines 23.

The process for producing a DRAM according to this embodiment will practically be described hereinunder with reference to FIGS. 3 to 10 (fragmentary sectional views respectively showing various manufacturing steps).

Figure 3:
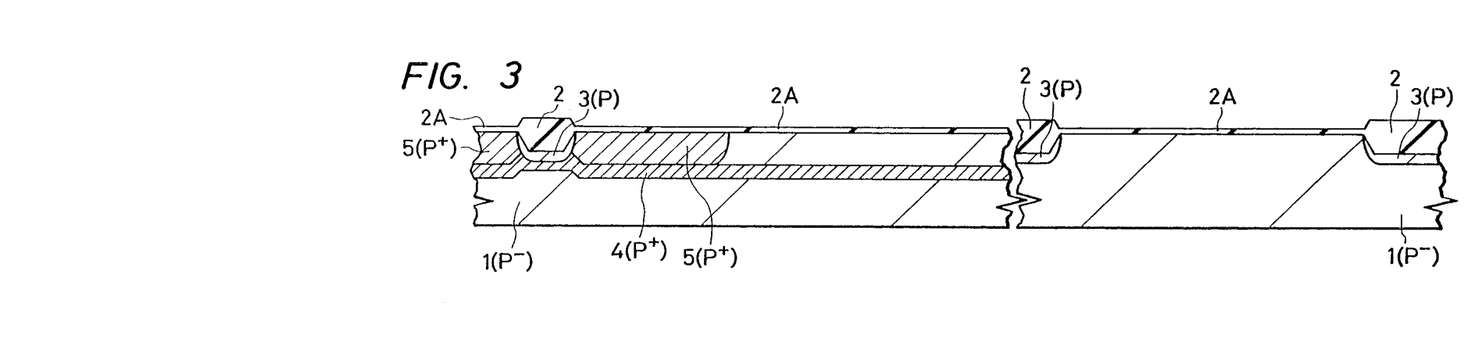
FIGS. 3 to 10 are sectional views of a memory cell of a DRAM and a peripheral circuit thereof, respectively showing various steps in a process for producing the DRAM according to one embodiment of the present invention.

First, a p⁻-type semiconductor substrate 1 defined by single crystal silicon is prepared.

Then, an n⁻-type well region (not shown) is formed in a predetermined principal surface portion of the semiconductor substrate 1. A p-channel MISFET of CMOS's is formed in this well region (description of the semiconductor element formed in the n⁻-type well region is omitted hereinafter).

A field insulator film 2 and a p-type channel stopper region 3 are formed on the principal surface of the semiconductor substrate 1 in the area between semiconductor element forming regions.

The field insulator film 2 is defined by a silicon oxide film formed by selectively oxidizing the principal surface of the semiconductor substrate 1. The field insulator film 2 is formed using a silicon nitride film (an oxidation-resistant mask) formed on the principal surface of the semiconductor substrate 1 in the semiconductor element forming regions through a silicon oxide film 2A.

The channel stopper region 3 is formed in such a manner that a p-type impurity (boron) is implanted into the principal surface of the semiconductor substrate 1 in the region for forming the field insulator film 2 in advance and then extendedly diffused by a heat treatment carried out to form the field insulator film 2.

Thereafter, a p-type impurity is implanted into a principal surface portion of the semiconductor substrate 1 in each of the regions for forming a memory cell and for forming a data storage capacitance element C to form p⁺-type semiconductor regions 4 and 5 as shown in FIG. 3.

The p⁺-type semiconductor region 4 has an impurity concentration, for example, $1 \times 10^{17}$ to $1 \times 10^{18}$ [atoms/cm³] and is formed so as to have a highest impurity concentration portion at a depth of 0.7 [μm] from the principal surface of the semiconductor substrate 1. The semiconductor region 4 can be formed by ion implantation of a p-type impurity (boron).

The p⁺-type semiconductor region 5 has an impurity concentration of, for example $1 \times 10^{17}$ [atoms/cm³] and is formed so as to have a highest impurity concentration portion at a depth of about 0.7 [μm] from the principal surface of the semiconductor substrate 1. The semiconductor region 5 can be formed by ion implantation of a p-type impurity (boron).

The semiconductor region 5 may be formed by implanting a p-type impurity in two stages with a view to improving the dielectric strength of the pn junction between the semiconductor region 5 and an n-type semiconductor region 6 (described later) and reducing the extension of a depletion region formed so as to extend from the pn junction toward the semiconductor region 5.

During the steps of forming the semiconductor regions 4 and 5 (together with a region 6 described later), a region for forming a MISFET Qn constituting a peripheral circuit is covered with a protecting film such as a photoresist film although it is not illustrated.

After the steps of forming the semiconductor regions 4 and 5 shown in FIG. 3, an n-type semiconductor region 6 is formed in the principal surface portion of the semiconductor region 5 (or the semiconductor substrate 1) within a region for forming a data storage capacitance element C of a memory cell. The semiconductor region 6 has an impurity concentration of, for example, $1 \times 10^{13}$ [atoms/cm³] and is formed so as to have a junction depth of about 0.20 to 0.25 [μm] from the principal surface of the semiconductor substrate 1. The semiconductor region 6 can be formed by ion implantation of an n-type impurity (arsenic or phosphorous).

Figure 4:
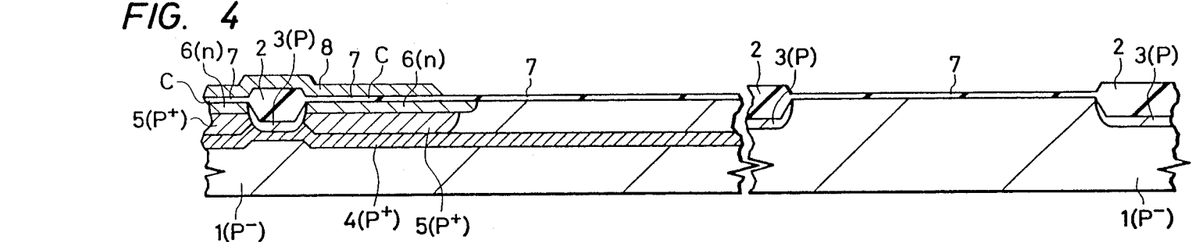

Then, the silicon oxide film 2A in the semiconductor element forming region is removed, and a dielectric film 7 is formed on the principal surface of the semiconductor region 6 mainly in a region for forming a data storage capacitance element C of a memory cell. The dielectric film 7 is defined by, for example, a silicon oxide film, a silicon nitride film or a composite film thereof, and formed so as to have a film thickness of about 100 to 150 [Å].

Thereafter, a plate electrode 8 is formed on the dielectric film 7 in the region for forming a data storage capacitance element C of a memory cell as shown in FIG. 4. The plate electorde 8 is formed using, for example, a polycrystalline silicon film having an impurity implanted therein in order to lower the resistance. This plate electrode 8 is formed in the step of forming a first-level conductor layer among the manufacturing steps.

In the step of forming the plate electrode 8, the data storage capacitance element C of a memory cell is substantially completed.

After the step of forming the plate electrode 8 shown in FIG. 4, the dielectric film 7 except for the portion thereof used to constitute the data storage capacitance element C is removed.

Figure 5:
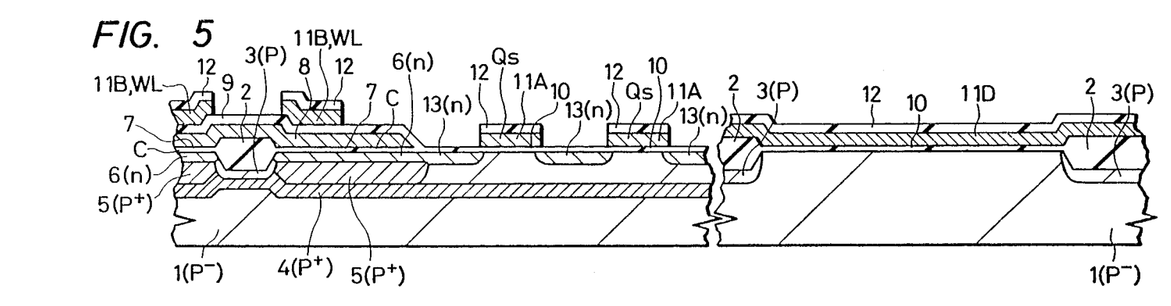

Then, an insulator film 9 covering the plate electrode 8 is formed, and a gate insulator film 10 is formed on the principal surface of the semiconductor substrate 1 in each of the regions for forming a MISFET Qs of a memory cell and for forming a MISFET Qn of a peripheral circuit.

The insulator film 9 is formed using a silicon oxide film formed by, for example, oxidizing the surface of the plate electrode 8 so that the plate electrode 8 can be electrically isolated from a word line which is formed in the subsequent step, the insulator film 9 having a film thickness of about 3000 to 4000 [Å].

The gate insulator film 10 is formed using a silicon oxide film formed by oxidizing the principal surface of the semiconductor substrate 1, the film 10 having a thickness of about 120 to 150 [Å]. The gate insulator film 10 is formed on the principal surface of the semiconductor substrate 1 in each of the regions for forming the MISFETs Qs and Qn, respectively, said principal surface being made free from any damage which would otherwise be caused by an anisotropic etching described later. In other words, it is possible to improve the quality of the gate insulator film 10.

Thereafter, a second-level conductor layer 11D and an insulator film 12 are successively formed so as to extend over the gate insulator film 10 in the region for forming the MISFET Qs, the insulator film 9 and the gate insulator film 10 in the region for forming the MISFET Qn.

The second-level conductor layer 11D is formed by, for example, implanting an impurity (e.g., phosphorous) which lowers the resistance into a polycrystalline silicon film formed by CVD, the layer 11D having a film thickness of about 3000 [Å]. Since the substantial resistance of the word lines can be lowered by means of a fourth-level conductor layer (described later), the second-level conductor layer 11D can be formed using a polycrystalline silicon film, which is higher in terms of resistivity than a polycide film or the like but has higher reliability in manufacture than the latter.

The insulator film 12 is formed using a silicon oxide film having a thickness of about 4000 [Å] so that it is possible to ensure the required dielectric strength of the area between the gate electrode of the MISFET Qs and the corresponding data line (described later). The insulator film 12 may be defined by a composite film consisting of an insulator film and an etching stopper layer of, for example, silicon oxide film, provided thereon in order to increase the difference in terms of etching rate between the insulator film 12 and another insulator film formed thereabove.

Then, in the memory cell array the insulator film 12 and the second-level conductor layer 11D are successively patterned to form the gate electrode 11A of each of the MISFETs Qs and word lines (WL) 11B. During the step of forming the gate electrode 11A and the word lines 11B, the region for forming the MISFET Qn constituting a peripheral circuit is covered with a protecting film such as a photoresist film.

Thereafter, n-type semiconductor regions 13 which are to be used as source and drain regions, respectively, are formed in the principal surface portion of the semiconductor substrate 1 at both side portions, respectively, of the gate electrode 11A in the region for forming the MISFET Qs as shown in FIG. 5. The semiconductor regions 13 are formed using as an impurity implantation mask an etching mask formed by patterning the insulator film 12, the field insulator film 2 or the like, or the second-level conductor layer 11D. Since the region for forming the MISFET Qn constituting a peripheral circuit is covered with the conductor layer 11D, no impurity for forming the semiconductor regions 13 is implanted into said region. The semiconductor regions 13 can be formed by, for example, ion implantation of an n-type impurity (e.g., arsenic) at a concentration of about $1 \times 10^{14}$ [atoms/cm$^2$]. Since the semiconductor regions 13 are formed at a relatively low impurity concentration, it is possible to lower the field strength in the vicinity of the drain region and to thereby prevent deterioration with time of the threshold voltage due to hot carriers.

By carrying out the step of forming the semiconductor regions 13, the switching MISFET Qs of the memory cell is substantially completed and, at the same time, the memory cell is substantially completed with the MISFET Qs and the data storage capacitance element C.

After the step of forming the semiconductor regions 13 shown in FIG. 5, an insulator film is formed all over the surface of the substrate 1, the insulator film being mainly used to form an insulator film 14A for defining a contact hole 16 and an insulator film 14B for electrically isolating the gate electrode 11A and the word line 11B from a data line formed thereabove. This insulator film is formed using, for example, a silicon oxide film formed by CVD, the insulator film having a thickness of about 3000 [Å]. Then, the memory cell array is covered with a resist film (not shown) except for the semiconductor region 13 between the two MISFETs Qn. The resist film is formed on a film which remains in the form of the insulator film 14B in FIG. 6 so that the resist film has the same pattern as that of the insulator film 14B.

Figure 6:
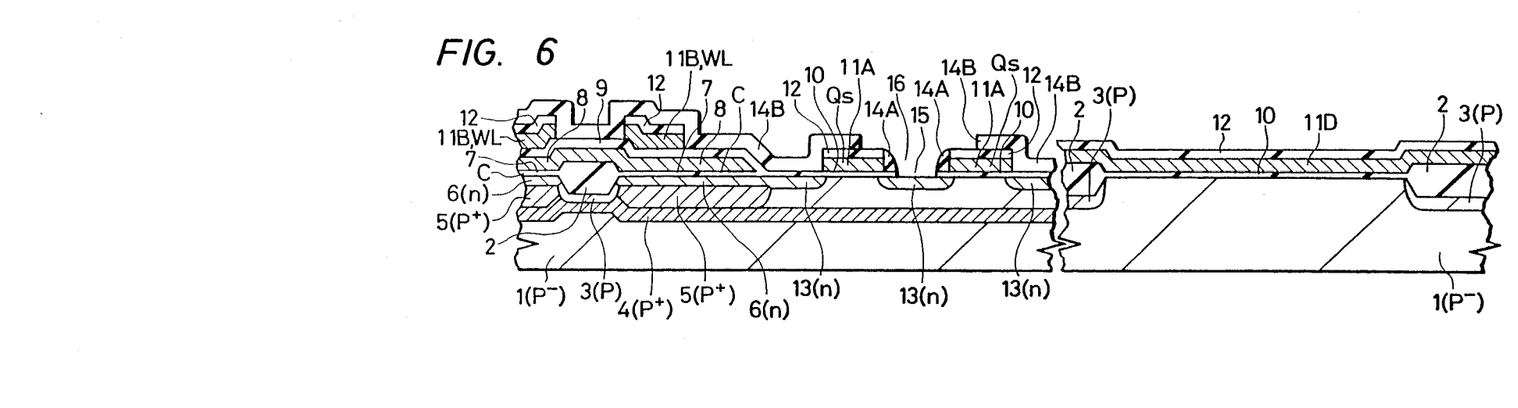

Thereafter, etching is carried out in such a manner that, in the memory cell array the surface of the semiconductor region 13 (the region to be connected to a data line) which is exposed from the resist film and surrounded by the gate electrodes 11A and the field insulator films 2 is subjected to selective etching, whereas, in the peripheral circuit the whole surface thereof is etched. In this etching process, an anisotropic etching such as reactive ion etching mainly using CF$_4$ gas is employed. As a result of the etching, as shown in FIG. 6, all the above-described insulator film is removed in the peripheral circuit, resulting in the insulator film 12 being exposed. On the other hand, in the memory cell array, the above-described insulator film covered with the resist film is left as it is and employed as the insulator film 14B. In the region exposed from the resist film, insulator films (side wall spacers) 14A are formed on the respective side walls of each gate electrode 11A and the insulator film 12 by self-alignment. The insulator film 14A is formed only on one side wall of the gate electrode 11A. Thus, according to this embodiment, the intermediate and side wall insulator films 14B and 14A are formed from the same insulator film by a single etching process. Further, this etching process enables simultaneous formation of contact holes 15 and 16 which allow one of the semiconductor regions 13 of the MISFET Qs to be exposed.

The contact hole 15 is defined by the field insulator film 2 and the insulator film 14A which is formed on one side portion of the gate electrode 11A of the MISFET Qs by an anisotropic etching so as to be self-aligned with respect to the gate electrode 11A. In other words, the contact hole 15 is self-aligned with respect to the gate electrode 11A, the field insulator film 2 and the semiconductor region 13.

The contact hole 16 is defined by the insulator film 14B.

Thus, the insulator film 12 is formed on the gate electrode 11A at a region for connection between one of the semiconductor regions 13 of the MISFET Qs of each memory cell and the corresponding data line (described later) and an insulator film covering the whole surface is formed, and thereafter, the insulator film at said connection region is subjected to an anisotropic etching to form the insulator film 14A, and the contact hole 15 is defined by this insulator film 14A, thereby forming the insulator film 14B which electrically isolates the gate electrode 11A and the word line 11B from the corresponding data line, and enabling the contact hole 15 to be self-aligned with respect to the gate electrode 11A and the like. In other words, no margin of area for mask alignment is needed when one of the semiconductor regions 13 of the MISFET Qs of each memory cell and the corresponding data line are connected together, and the area required for the connection can be reduced. Accordingly, it is possible to reduce the area occupied by each memory cell and to thereby increase the integration density of the DRAM.

Further, the insulator film 14B at the region for connection with the data line (above one of the semiconductor regions 13) is subjected to an anisotropic etching to enable the contact holes 15 and 16 to be defined by the insulator films 14A and 14B, respectively, thereby eliminating the need for an etching step in which another insulator film is formed on the insulator film 14B to cover, for example, the other semiconductor region 13, and a contact hole is formed in this insulator film. It is therefore possible to prevent damage to the insulator films 14A and 12 due to etching. Accordingly, the dielectric strength of the area between the gate electrode 11A of the MISFET Qs and the corresponding data line is increased, and this enables an improvement in the electrical reliability of the DRAM.

Since the insulator films 14A and 12 are effectively prevented from being damaged by etching, it is possible to eliminate the need to carry out the step of forming an intermediate conductor layer such as a polycrystalline silicon film which covers the insulator films 14A and 12 between the semiconductor region 13 and the data line.

Further, the prevention of etching damage to the insulator films 14A and 12 enables these insulator films to have an increased thickness, so that it is possible to further improve the dielectric strength of the area between the gate electrode 11A and the data line.

Although the region for forming the MISFET Qn constituting a peripheral circuit is also subjected to an anisotropic etching when the contact holes 15 and 16 are formed thereby, since the gate insulator film 10 and the second-level conductor layer 11D are formed over the principal surface of the semiconductor substrate 1 within the region for forming the MISFET Qn in the same manufacturing steps as those for the MISFET Qs and said anisotropic etching is carried out to etch only the insulator film 14B on the insulator film 12, no damage is caused to the principal surface of the semiconductor substrate 1 in the region for forming the MISFET Qn.

Figure 7:
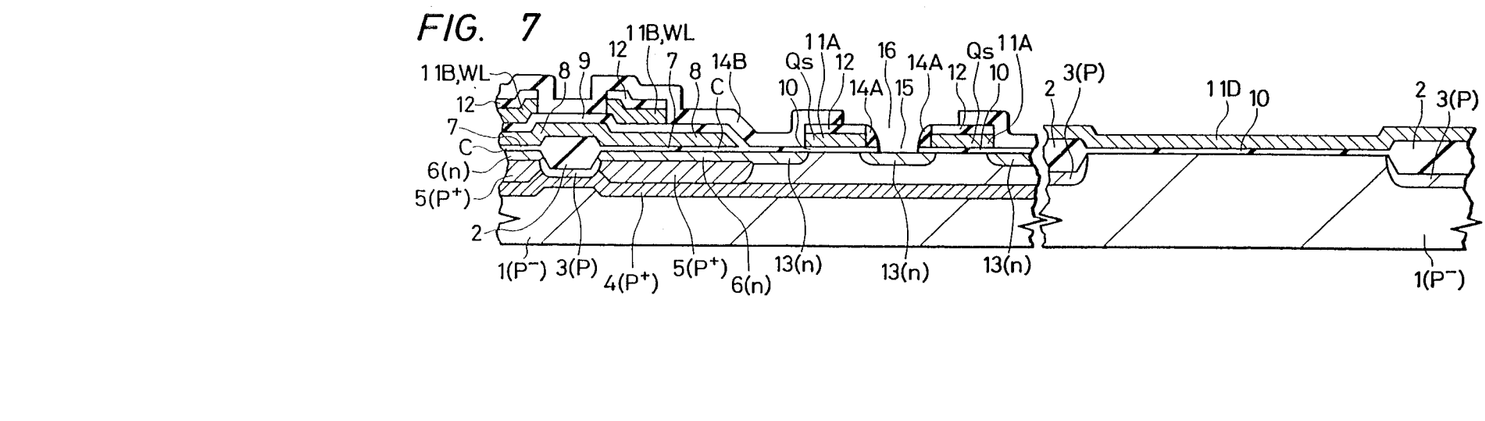

After the step of forming the contact holes 15 and 16 shown in FIG. 6, the insulator film 12 on the second-level conductor layer 11D is removed in the region for forming the MISFET Qn constituting a peripheral circuit as shown in FIG. 7.

Figure 8:
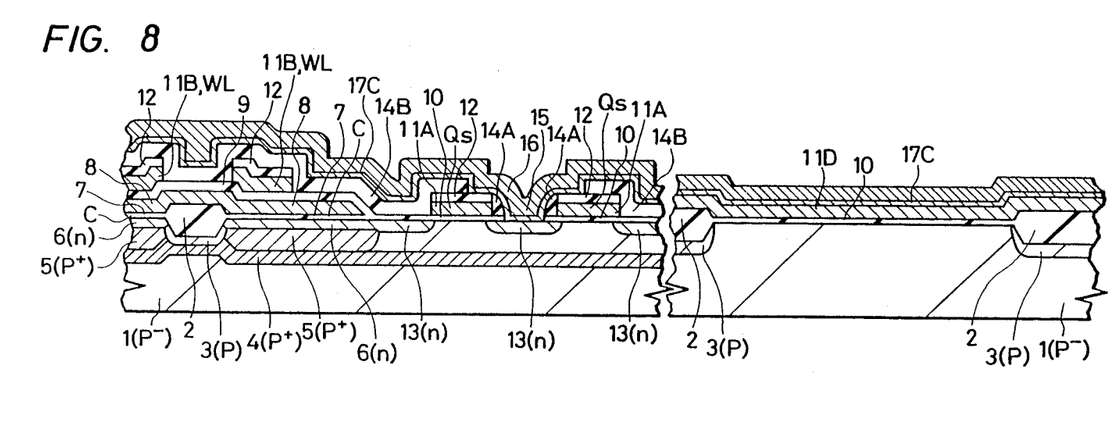

After the step of removing the insulator film 12 shown in FIG. 7, a third-level conductor layer 17C is formed so as to extend over the insulator film 14B in the memory cell array and over the conductor layer 11D in the region for forming the MISFET Qn constituting a peripheral circuit. In the memory cell array, the third-level conductor layer 17C is electrically connected to one of the semiconductor regions 13 of the MISFET Qs through the contact holes 15 and 16. The third-level conductor layer 17C is formed from, for example, a polycide film consisting of a polycrystalline silicon film and a refractory metal silicide film. The polycrystalline silicon film is formed by CVD and has an impurity (e.g., phosphorous) implanted therein to lower the resistance, the film having a thickness of about 1000 [Å]. The refractory metal silicide film is formed by sputtering or CVD and has a thickness of about 3000 [Å]. The third-level conductor layer 17C is preferably made of a heat-resistant material which is capable of enduring extended diffusion of an impurity carried out thereafter to form semiconductor regions 18 and 20.

Figure 9:
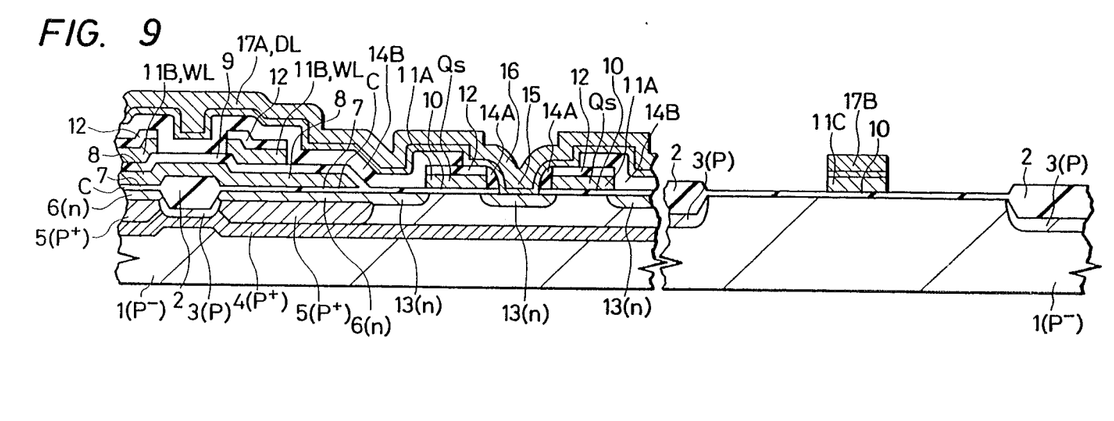

After the step of forming the third-level conductor layer 17C shown in FIG. 8, the conductor layer 17C in the memory cell array is subjected to patterning to form a data line (DL) 17A as shown in FIG. 9. In the same step as that of forming the data line 17A, the third-level conductor layer 17C and the second-level conductor layer 11D in the region for forming the MISFET Qn are successively patterned to form a gate electrode consisting of the conductor layers 11C and 17B which are stacked one upon the other.

As described above, the gate electrode of the MISFET Qn is formed from the conductor layer 11C which is defined by the same conductor layer as that for the gate electrode 11A of the MISFET Qs and the word line 11B and the conductor layer 17B which is defined by the same conductor layer as that for the data line 17A. Accordingly, it is possible to reduce the number of steps required to form the gate electrode of the MISFET Qn and also to decrease the resistance of this gate electrode.

After the step of forming the data line 17A and the gate electrode of the MISFET Qn shown in FIG. 9, n-type semiconductor regions 18 are formed in the principal surface portion of the semiconductor substrate 1 at both sides, respectively, of the gate electrode of the MISFET Qn. The semiconductor regions 18, which have the LDD structure, can be formed by, for example, ion implantation of an n-type impurity (e.g., phosphorous) at a concentration of about $1 \times 10^{13}$ [atoms/cm$^2$]. This implantation of an n-type impurity is carried out using the gate electrode and the field insulator film 2 as an impurity implantation mask.

Figure 10:
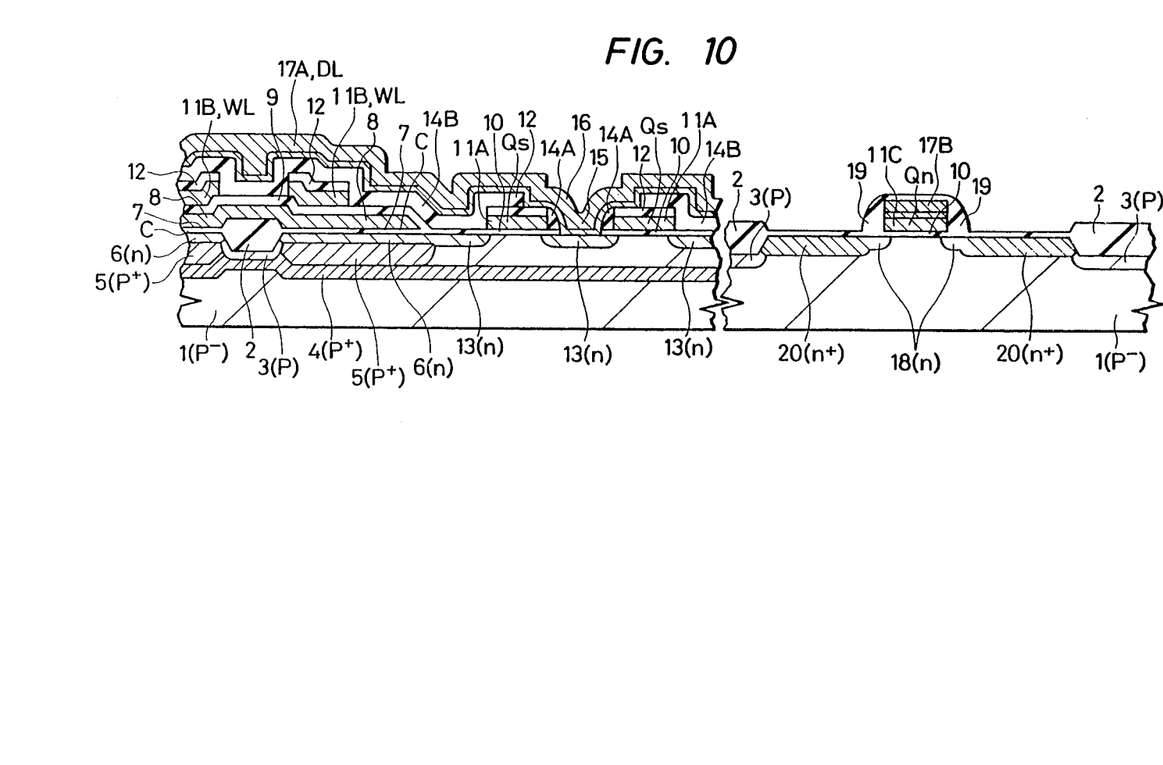

Thereafter, impurity implantation masks 19 (side wall spacers) are formed at both side portions, respectively, of the gate electrode of the MISFET Qn. The masks 19 can be formed by, for example, applying an anisotropic etching to a silicon oxide film formed all over the surface of the substrate 1 by CVD. The insulator film which defines the masks 19 is also formed at each side wall of the data line 17A in the memory cell array. As a result, the slope at the region where the word line 23 (described later) intersects the data line 17A is made gentle, so that the word line 23 can be formed without any disconnection and any increase in resistance.

With the impurity implantation masks 19, n$^+$-type semiconductor regions 20 are formed at both sides, respectively, of the gate electrode of the MISFET Qn as shown in FIG. 10. The semiconductor regions 20, which are respectively used as source and drain regions, can be formed by, for example, ion implantation of an n-type impurity (e.g., arsenic) at a concentration of about $1 \times 10^{15}$ [atoms/cm$^2$].

By carrying out the step of forming the semiconductor regions 20, the MISFET Qn constituting a peripheral circuit is substantially completed.

Thus, the gate insulator film 10 of the MISFET Qn is formed in the same manufacturing step as that for forming the gate insulator film 10 of the MISFET Qs of each memory cell, while a part of the gate electrode of the MISFET Qn is formed in the same manufacturing step as that for forming the gate electrode 11A of the MISFET Qs and the word line 11B, and after the formation of the contact holes 15 and 16 for connection between one of the semiconductor regions 13 of the MISFET Qs and the data line 17A in the memory cell array, the gate electrode of the MISFET Qn is completed in the same manufacturing step as that for forming the data line 17A in the memory cell array, whereby there is no damage to the principal surface of the semiconductor substrate 1 in the region for forming the MISFET Qn which damage would otherwise be caused by the formation of the contact holes 15 and 16 and it is therefore possible to improve the quality of the gate insulator film 10 formed in the region for forming the MISFET Qn. Accordingly, it is possible to increase the source-gate breakdown voltage of the MISFET Qn and prevent deterioration of the threshold voltage.

After the step of forming the semiconductor regions 20 shown in FIG. 10, an insulator film 21, contact holes 22 and word lines (WL) and wirings 23 are successively formed a shown in FIGS. 1 and 2. The word lines and wirings 23 are formed in the step of forming the fourth-level conductor layer and may be formed from, for example, an aluminum film or an aluminum film containing a predetermined additive.

By carrying out the above-described series of manufacturing steps, the DRAM according to this embodiment is completed.

Although the invention accomplished by the present inventor has been practically described by way of one embodiment, the present invention is not necessarily limitative to the above-described embodiment and various changes and modifications may, of course, be imparted thereto without departing from the scope and spirit of the invention.

For example, the present invention may be applied to a DRAM in which each memory cell is constituted by a data storage capacitance element C formed in such a manner that a slit (or a narrow groove or trench) is formed in the principal surface of the semiconductor substrate 1 and the amount of electric charge stored to constitute data is increased in the depthwise direction of the substrate 1 utilizing this slit.

The present invention may also be applied to a DRAM in which each memory cell is constituted by a data storage capacitance element C composed of two conductor layers which are formed on the semiconductor substrate 1 with a dielectric film interposed therebetween.

The present invention may also be applied to semiconductor integrated circuit devices having a storage function other than DRAMs. More specifically, the present invention may be applied to semiconductor integrated circuit devices having a nonvolatile storage function, such as semiconductor integrated circuit devices having a SRAM (Static Random-Access Memory), mask-programmed ROMs, EPROMs and EEPROMs. In other words, the present invention may be applied to any semiconductor integrated circuit device which includes a field-effect transistor having a wiring such as a data line connected to its source or drain region.

Advantageous effects which can be obtained by a represented one of the novel techniques disclosed in this application will briefly be described below.

There is provided a semiconductor integrated circuit device having first and second field-effect transistors, wherein the gate electrode of the first field-effect transistor is defined by a first-level conductor layer, while a wiring which is connected by self-alignment to the source or drain region of the first field-effect transistor is defined by a second-level conductor layer, and the gate electrode of the second field-effect transistor is defined by a combination of the first- and second-level conductor layers which are stacked one upon the other, whereby it is possible to reduce the area required for connection between the source or drain region of the first field-effect transistor and the wiring and to thereby increase the integration density, and it is also possible to lower the resistance of the gate electrode of the second field-effect transistor and to thereby increase the operating speed of the device.

Further, since the respective gate electrodes of the first and second field-effect transistors are formed through respective gate insulator films which are formed on the principal surface of a semiconductor substrate in the same manufacturing step, the first and second field-effect transistors can be formed on a semiconductor substrate having no damage generated thereto. Accordingly, it is possible to increase the dielectric strength of the gate insulator film and to thereby improve the electrical reliability of the device.

What is claimed is:

1. In a semiconductor integrated circuit device including a memory cell array in which a plurality of memory cells each having a capacitor and a first field effect transistor formed at a single semiconductor substrate are arrayed in rows and columns, said memory cell array including data lines and word lines, each data line being in electrical connection with one of the source and drain regions of first field effect transistors of individual memory cells arrayed in a respective row of said memory cell array and each word line being in electrical connection with the gate electrode of a first field effect transistors of memory cells arrayed in a respective column of said memory cell array; and peripheral circuitry including second field effect transistors formed at said semiconductor substrate, the improvement comprising:

memory cells each including a first field effect transistor having a gate electrode of a single layer structure comprising a polycrystalline silicon layer disposed over a main surface of said semiconductor substrate;

each of said data lines consists of a multilayer structure comprising a second polycrystalline silicon layer and a refractory metal silicide layer; and peripheral circuitry having second field effect transistors each having a gate consisting of a multi-layer structure, disposed over said main surface of said semiconductor substrate, comprising said first polycrystalline silicon layer, said second polycrystalline silicon layer and said refractory metal silicide layer.

2. A semiconductor integrated circuit device according to claim 1, wherein said word line consists of said first polycrystalline silicon layer and an aluminum layer which is parallel to said first polycrystalline silicon layer.

3. A semiconductor integrated circuit device according to claim 2, wherein said aluminum layer is electrically connected to said first polycrystalline silicon layer forming the gate electrodes of said first field effect transistors.

4. A semiconductor integrated circuit device according to claim 1, wherein said refractory metal silicide layer is formed on said second polycrystalline silicon layer and extending over each of said first field effect transistors.

5. A semiconductor integrated circuit device according to claim 4, wherein with respect to the gate electrode of each of said second field effect transistors, said refractory metal silicide layer is formed on said second polycrystalline silicon layer which is formed on said first polycrystalline silicon layer.

6. A semiconductor integrated circuit device according to claim 1, wherein one of a source and drain regions of said second field effect transistor is composed of a first semiconductor region having low impurity concentration and a second semiconductor region having high impurity concentration, further wherein one of a source and drain regions of said first field effect transistor is composed of a third semiconductor region having a lower impurity concentration than that of said second semiconductor region.

7. A semiconductor integrated circuit device according to claim 1, wherein the gate electrode of said first field effect transistor has a side wall spacer only at the gate side above a source or drain region to which said data line is connected.

8. A semiconductor integrated circuit device according to claim 3, wherein said refractory metal silicide layer is formed on said second polycrystalline silicon layer and extending over each of said first field effect transistors.

9. A semiconductor integrated circuit device according to claim 8, wherein with respect to the gate electrode of each of said second field effect transistors, said refractory metal silicide layer is formed on said second polycrystalline silicon layer which is formed on said first polycrystalline silicon layer.

10. A semiconductor integrated circuit device according to claim 9, wherein one of a source and drain regions of said second field effect transistor is composed of a first semiconductor region having low impurity concentration and a second semiconductor region having high impurity concentration, further wherein one of a source and drain regions of said first field effect transistor is composed of a third semiconductor region having a lower impurity concentration than that of said second semiconductor region.

11. A semiconductor integrated circuit device according to claim 10, wherein the gate electrode of said first field effect transistor has a side wall spacer only at the gate side above a source or drain region to which said data line is connected.

12. A semiconductor integrated circuit device according to claim 3, wherein aluminum is used as the wiring layer for the source and drain region connections of said second field effect transistors.

13. A semiconductor integrated circuit device according to claim 3, wherein said aluminum layer is electrically connected to said first polycrystalline silicon layer forming the gate electrodes of said first field effect transistors via respective contact holes.

14. A semiconductor integrated circuit device according to claim 13, wherein said aluminum layer forming said word lines and said second polycrystalline film and said refractory metal silicide film forming said data lines are laterally disposed over said memory cell array in orthogonal directions.

15. A semiconductor integrated circuit device according to claim 14, wherein said word lines and said data are separated by an insulation film and wherein said word lines are above said data lines.

16. A semiconductor integrated circuit device according to claim 1, wherein each of the source and drain regions of said second field effect transistors are composed of a first lightly-doped semiconductor region and a larger second semiconductor region having high impurity concentration, said first semiconductor region being contiguous with said second semiconductor and adjacent to a channel side of said second field effect transistor, and wherein each of the source and drain regions of said first field effect transistors is composed of a third semiconductor region having a lower impurity concentration than that of said second semiconductor region.

17. A semiconductor integrated circuit device according to claim 9, wherein each of the source and drain regions of said second field effect transistors are composed of a first lightly-doped semiconductor region and a larger second semiconductor region having high impurity concentration, said first semiconductor region being contiguous with said second semiconductor and adjacent to a channel side of said second field effect transistor, and wherein each of the source and drain regions of said first field effect transistors is composed of a third semiconductor region having a lower impurity concentration than that of said second semiconductor region.

18. A semiconductor integrated circuit device according to claim 12, further including a potential barrier layer provided in a deep portion of said semiconductor substrate sufficiently below the source and drain regions of said first field effect transistors so that its highest impurity concentration portion avoids contact with said source and drain regions, said potential barrier layer preventing minority carriers generated in a portion of said semiconductor substrate deeper than itself from entering the memory cells.

19. A semiconductor integrated circuit device according to claim 18, wherein said second field-effect transistors are complementary channel type MISFETs.

20. A semiconductor integrated circuit device according to claim 1, wherein said second field-effect transistors are complementary channel type MISFETs.

* * * * *